United States Patent
Cho et al.

(10) Patent No.: US 11,216,362 B2
(45) Date of Patent: Jan. 4, 2022

(54) DATA STORAGE DEVICE AND OPERATING METHOD THEREOF

(71) Applicant: SK hynix Inc., Gyeonggi-do (KR)

(72) Inventors: Young Ick Cho, Seoul (KR); Byeong Gyu Park, Gyeonggi-do (KR); Sung Kwan Hong, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 97 days.

(21) Appl. No.: 16/524,777

(22) Filed: Jul. 29, 2019

(65) Prior Publication Data

US 2020/0065241 A1 Feb. 27, 2020

(30) Foreign Application Priority Data

Aug. 22, 2018 (KR) .......................... 10-2018-0097844

(51) Int. Cl.
*G06F 12/02* (2006.01)
*G11C 11/408* (2006.01)
*G06F 12/1009* (2016.01)

(52) U.S. Cl.
CPC ...... *G06F 12/0246* (2013.01); *G06F 12/1009* (2013.01); *G11C 11/4082* (2013.01); *G06F 2212/7201* (2013.01)

(58) Field of Classification Search
CPC .................................................. G06F 12/0246
USPC ....................................................... 711/202
See application file for complete search history.

(56) References Cited

U.S. PATENT DOCUMENTS

| | | | | |
|---|---|---|---|---|
| 2003/0033431 A1* | 2/2003 | Shinomiya | .......... | G06F 12/1027 709/245 |
| 2012/0226850 A1* | 9/2012 | Nakanishi | ........... | G06F 12/1009 711/102 |
| 2014/0229657 A1* | 8/2014 | Karamov | .............. | G06F 3/0688 711/103 |
| 2019/0220416 A1 | 7/2019 | Jung et al. | | |

FOREIGN PATENT DOCUMENTS

KR 101810932 12/2017

\* cited by examiner

*Primary Examiner* — Jae U Yu
(74) *Attorney, Agent, or Firm* — IP & T Group LLP

(57) ABSTRACT

A data storage device includes a nonvolatile memory device including an address mapping table; a memory including a sequential map table in which sequential map entries for consecutive logical block addresses among logical block addresses are stored, the logical block addresses being received with write requests from a host device; and a processor configured to read one or more map segments, including logical block addresses of which mapping information is to be updated, from the address mapping table when a map update operation is triggered, store the read one or more map segments in the memory, sequentially change physical block addresses mapped to the respective logical block addresses to be updated, using a first sequential map entry including the logical block addresses to be updated which are stored in the sequential map table, and store the changed physical block addresses in the memory.

15 Claims, 13 Drawing Sheets

UMSL

MSLP

SMTP

FIG.4C

SMT

| Start LBA | Length | Start PBA (Block Number / Offset) | | Valid |
|---|---|---|---|---|
| LBA | Value | BLK Number | Offset | O/X |
| LBA | Value | BLK Number | Offset | O/X |
| LBA | Value | BLK Number | Offset | O/X |
| ⋮ | ⋮ | ⋮ | ⋮ | ⋮ |

Sequential Map Entry (pointing to first data row)

| Map Segment | Logical Address | Physical Address |
|---|---|---|
| 0 | LBA0 | PBA0 |
| | LBA1 | PBA1 |
| | ⋮ | ⋮ |
| | LBA99 | PBA99 |
| ⋮ | ⋮ | ⋮ |
| 99 | LBA9900 | PBA9900 |
| | LBA9901 | PBA9901 |
| | ⋮ | ⋮ |
| | LBA9999 | PBA9999 |

L2P Entry (pointing to LBA0/PBA0 row)

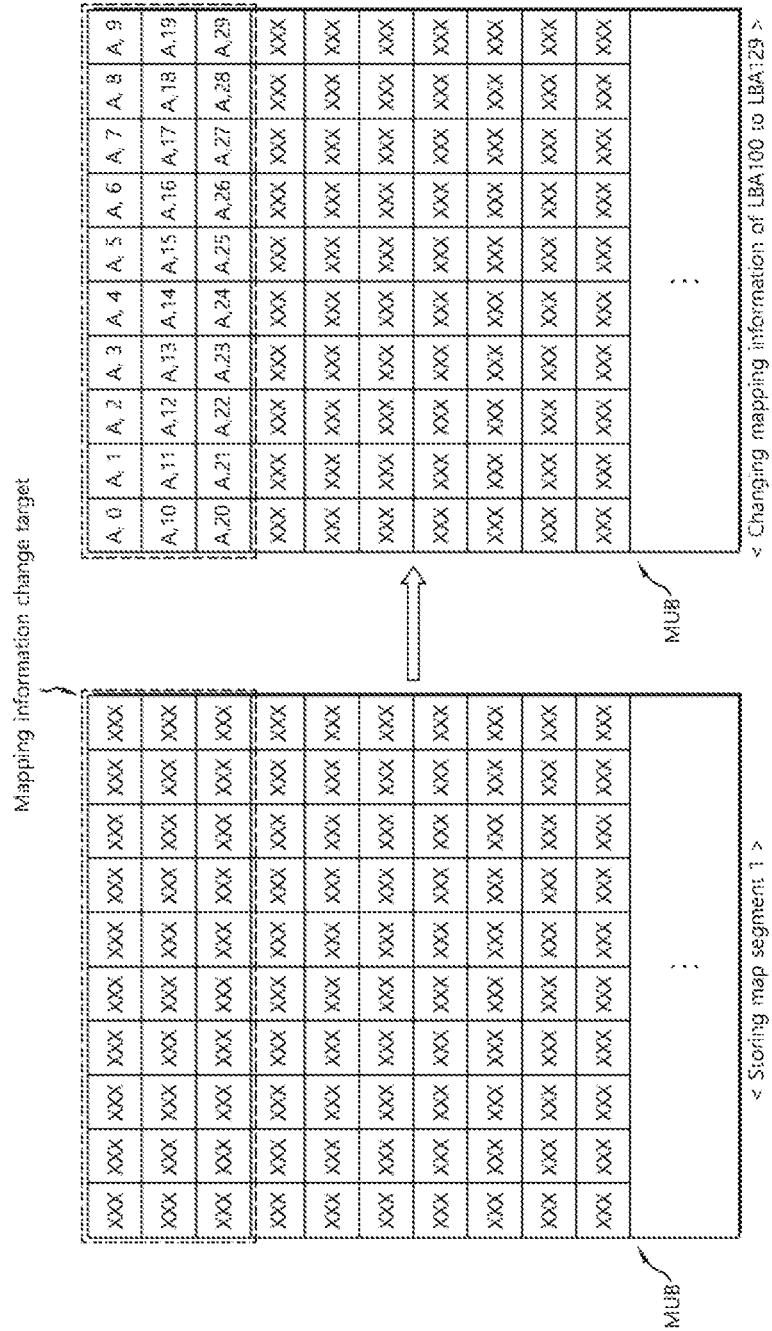

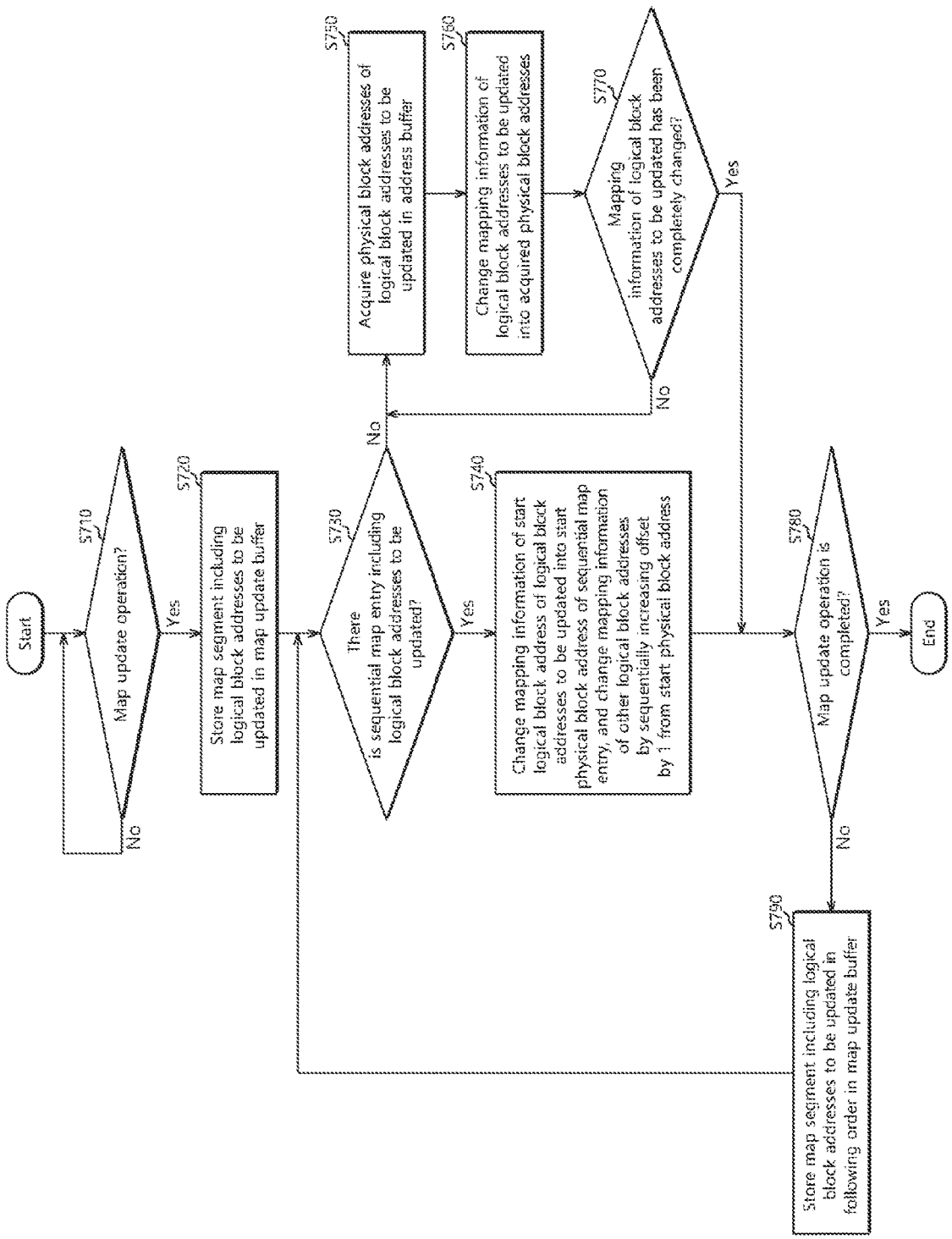

DATA STORAGE DEVICE AND OPERATING METHOD THEREOF

CROSS-REFERENCE TO RELATED APPLICATION

The present application claims priority under 35 U.S.C. § 119(a) to Korean application number 10-2018-0097844, filed on Aug. 22, 2018, in the Korean Intellectual Property Office, which is incorporated herein by reference in its entirety.

BACKGROUND

1. Technical Field

Various embodiments generally relate to an electronic device, and more particularly, to a data storage device and an operating method thereof.

2. Related Art

Recently, the paradigm for the computing environment has changed to the ubiquitous computing environment in which computer systems can be used anytime anywhere. Therefore, the use of portable electronic devices such as mobile phones, digital cameras and notebook computers has rapidly increased. Such portable electronic devices generally use a data storage device using a memory device. The data storage device is used to store data which are used in the portable electronic devices.

Since a data storage device using a memory device has no mechanical driver, the data storage device has excellent stability and durability, high information access speed, and low power consumption. A data storage device having such advantages includes a universal serial bus (USB) memory device, a memory card having various interfaces, a universal flash storage (UFS) device, and a solid state drive (SSD).

SUMMARY

Various embodiments are directed to a data storage device capable of reducing a map update time and an operating method thereof.

In an embodiment, a data storage device may include: a nonvolatile memory device including an address mapping table; a memory including a sequential map table, wherein the sequential map table stores sequential map entries for consecutive logical block addresses among logical block addresses, the logical block addresses being received with write requests from a host device; and a processor configured to: read one or more map segments, including logical block addresses of which mapping information is to be updated, from the address mapping table when a map update operation is triggered; store the read one or more map segments in the memory; sequentially change physical block addresses mapped to the respective logical block addresses to be updated, using a first sequential map entry including the logical block addresses to be updated which are stored in the sequential map table; and store the changed physical block addresses in the memory.

In an embodiment, an operating method of a data storage device may include: reading a map segment, including logical block addresses of which mapping information is to be updated, from the address mapping table when a map update operation is triggered, and storing the read map segment in a memory; and sequentially changing physical block addresses mapped to the respective logical block addresses to be updated, using a sequential map entry including the logical block addresses to be updated, and storing the changed physical block addresses in the memory.

In an embodiment, a data storage device may include: an address mapping table containing first information between logical addresses and physical addresses respectively mapped to each other; a sequential map table containing one or more sequential map entries each including a start logical address and a length of consecutive logical addresses and a start physical address; and a control component configured to: identify, within the sequential map table, a to-be-updated sequential map entry based on consecutive logical addresses in second information to be updated among the first information; update consecutive physical addresses corresponding to the consecutive logical addresses in the second information based on the identified sequential map entry; and update the first information based on the second information.

BRIEF DESCRIPTION OF THE DRAWINGS

FIG. 4C is a diagram illustrating a sequential map table, such as that of FIG. 2.

FIG. 5 is a diagram illustrating an address mapping table, such as that of FIG. 1.

FIG. 6B is a diagram illustrating an example in which mapping information of consecutive logical block addresses is changed.

FIG. 7 is a flowchart illustrating an operating method of a data storage device in accordance with an embodiment.

DETAILED DESCRIPTION

A data storage device and an operating method thereof are described below with reference to the accompanying drawings through various embodiments. Throughout the specification, reference to "an embodiment" or the like is not necessarily to only one embodiment, and different references to any such phrase are not necessarily to the same embodiment(s).

Figure 1:
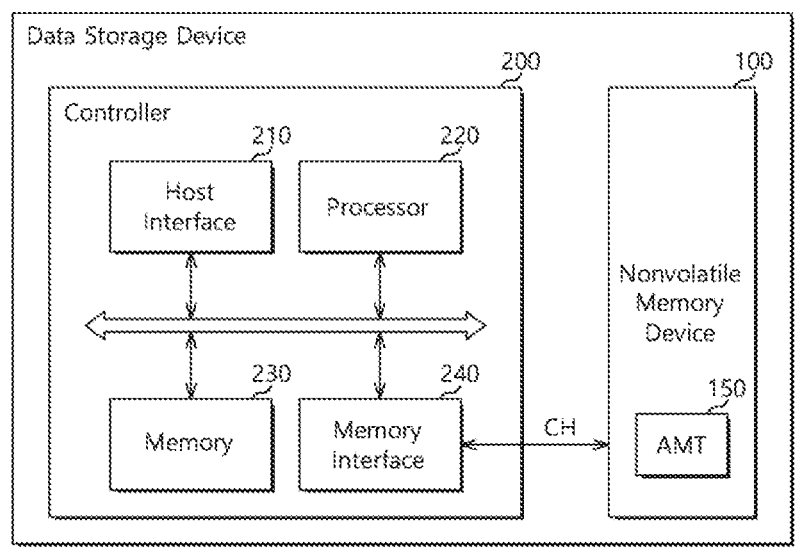
FIG. 1 is a block diagram illustrating a data storage device in accordance with an embodiment.

FIG. 1 illustrates a configuration of a data storage device 10 in accordance with an embodiment.

Referring to FIG. 1, the data storage device 10 t may store data accessed by a host device (not illustrated), such as a mobile phone, MP3 player, laptop computer, desktop computer, game machine, TV or in-vehicle infotainment system. The data storage device 10 may be referred to as a memory system.

The data storage device 10 may be configured as any of various storage devices, depending on an interface protocol coupled to the host device. For example, the data storage device 10 may be configured as any of a solid state drive (SSD), a multi-media card (MMC) such as an eMMC, RS-MMC or micro-MMC, a secure digital (SD) card such as a mini-SD or micro-SD, a universal storage bus (USB) storage device, a universal flash storage (UFS) device, a personal computer memory card international association (PCMCIA) card-type storage device, a peripheral component interconnection (PCI) card-type storage device, a PCI express (PCI-E) card-type storage device, a compact flash (CF) card, a smart media card and a memory stick.

The data storage device 10 may be fabricated as any of various types of packages, such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 10 may include a nonvolatile memory device 100 and a controller 200.

The nonvolatile memory device 100 may operate as a storage medium of the data storage device 10. The nonvolatile memory device 100 may be configured as any one of various types of nonvolatile memory devices such as a NAND flash memory device, a NOR flash memory device, a ferroelectric random access memory (FRAM) using ferroelectric capacitors, a magnetic random access memory (MRAM) using a tunneling magneto-resistive (TMR) layer, a phase change random access memory (PRAM) using chalcogenide alloys, and a resistive random access memory (ReRAM) using transition metal oxide, depending on memory cells.

FIG. 1 illustrates one instance of the data storage device 10, but this is only an example for clarity of illustration. The data storage device 10 may include a plurality of nonvolatile memory devices 100, and the present invention may also be applied in the same manner to the data storage device 10 including the plurality of nonvolatile memory devices 100.

The nonvolatile memory device 100 may include a memory cell array (not illustrated) having a plurality of memory cells arranged at the respective intersections between a plurality of bit lines (not illustrated) and a plurality of word lines (not illustrated). The memory cell array may include a plurality of memory blocks, and each of the memory blocks may include a plurality of pages.

For example, each memory cell of the memory cell array may be configured as a single level cell (SLC) for storing 1-bit data, a multi-level cell (MLC) for storing 2-bit data, a triple level cell (TLC) for storing 3-bit data, or a quadruple level cell (QLC) for storing 4-bit data. The memory cell array 110 may include one or more of the SLCs, the MLCs, the TLCs and the QLCs. Also, the memory cell array 110 may include memory cells with a two-dimensional horizontal structure or memory cells with a three-dimensional vertical structure.

The controller 200 may control overall operations of the data storage device 10 by driving firmware or software loaded to the memory 230. The controller 200 may decode and drive a code-based instruction or algorithm such as firmware or software. The controller 200 may be implemented in hardware or a combination of hardware and software.

The controller 200 may include a host interface 210, a processor 220, a memory 230 and a memory interface 240. Although not illustrated in FIG. 1, the controller 200 may further include an error correction code (ECC) engine which generates parity data by performing ECC encoding on write data provided from a host device, and performs ECC decoding on read data read from the nonvolatile memory device 100 using the parity data.

The host interface 210 may interface the host device and the data storage device 10 in response to a protocol of the host device. For example, the host interface 210 may communicate with the host device through any of various protocol including USB (universal serial bus), UFS (universal flash storage), MMC (multimedia card), PATA (parallel advanced technology attachment), SATA (serial advanced technology attachment), SCSI (small computer system interface), SAS (serial attached SCSI), PCI (peripheral component interconnection) and PCI-E (PCI express).

The processor 220 may include a micro control unit (MCU) and/or a central processing unit (CPU). The processor 220 may process a request transferred from the host device. In order to process the request transferred from the host device, the processor 220 may drive a code-based instruction or algorithm, i.e., firmware, which is loaded to the memory 230, and control the nonvolatile memory device 100 and internal function blocks such as the host interface 210, the memory 230 and the memory interface 240.

The processor 220 may generate control signals for controlling an operation of the nonvolatile memory device 100, based on requests transferred from the host device, and provide the generated control signals to the nonvolatile memory device 100 through the memory interface 240.

The memory 230 may be configured as a RAM such as a dynamic RAM (DRAM) or static RAM (SRAM). The memory 230 may store the firmware driven by the processor 220. Furthermore, the memory 230 may store data required for driving the firmware, for example, metadata. That is, the memory 230 may operate as a working memory of the processor 220.

The memory 230 may include a buffer for temporarily storing write data to be transferred to the nonvolatile memory device 100 from the host device or read data to be transferred to the host device from the nonvolatile memory device 100. That is, the memory 230 may operate as a buffer memory.

The memory interface 240 may control the nonvolatile memory device 100 under control of the processor 220. The memory interface 240 may also be referred to as a memory controller. The memory interface 240 may provide the control signals generated by the processor 220 to the nonvolatile memory device 100. The control signals may include a command, an address and an operation control signal and the like, which are provided to control the nonvolatile memory device 100. The memory interface 240 may provide write data to the nonvolatile memory device 100, or receive read data from the nonvolatile memory device 100.

Figure 2:
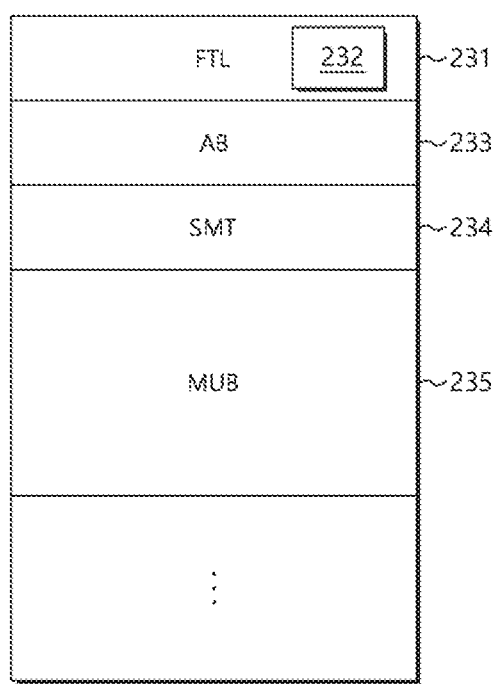
FIG. 2 is a diagram illustrating a memory, such as that of FIG. 1.

FIG. 2 illustrates the memory 230 of FIG. 1.

Referring to FIG. 2, the memory 230 in accordance with an embodiment may include a first region 231, a second region 233, a third region 234 and a fourth region 235. For clarity of illustration, FIG. 2 illustrates that the memory 230 includes four regions. However, the memory 230 may further include one or more other regions for storing various data. For example, the memory 230 may further include a command queue region for queuing commands which are generated based on requests received from the host device.

The first region 231 of the memory 230 may store a flash translation layer (FTL). The FTL may be software driven by the processor 220, and the processor 220 may drive the FTL to control a unique operation of the nonvolatile memory device 100, and provide device compatibility to the host device. As the FTL is driven, the data storage device 10 may be recognized and used as a general data storage device such as a hard disk by the host device. The FTL may include modules for performing various functions. The FTL may be stored in a system region (not illustrated) of the nonvolatile memory device 100. When the data storage device 10 is powered on, the FTL may be read from the system region of the nonvolatile memory device 100 and loaded to the first region 231 of the memory 230.

The first region 231 of the memory 230 may include a metadata region 232 for storing metadata required for driving various modules included in the FTL. The metadata stored in the metadata region 232 will be described below with reference to FIG. 3B.

The second region 233 of the memory 230 may be used as an address buffer AB which stores mapping information representing relationships between write addresses received from the host device, i.e., logical block addresses LBAs, and respective actual addresses of the nonvolatile memory device 100, i.e. physical block addresses PBAs. The address buffer AB will be described below with reference to FIG. 4A.

The third region 234 of the memory 230 may be used to store a sequential map table SMT including sequential map entries corresponding to sequential write requests received from the host device. The sequential map entry may include a start logical block address of consecutive logical block addresses LBAs, the number (the length) of the consecutive logical block addresses LBAs is greater than or equal to a threshold value, and a start physical block address corresponding to the start logical block address of the consecutive logical block addresses LBAs.

The fourth region 235 of the memory 230 may be used as a map update buffer MUB for storing one or more map segments including logical block addresses LBAs to be updated, among a plurality of map segments MS0 to MS99 (refer to FIG. 5) which are included in an address mapping table (AMT) 150 (see FIGS. 1 and 5).

Figure 3A:
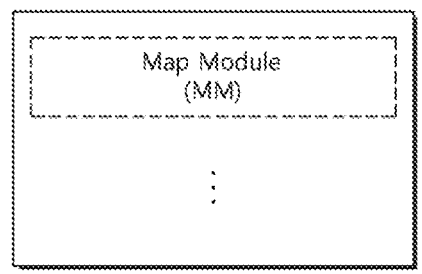
FIG. 3A is a diagram illustrating a flash translation layer (FTL), such as that of FIG. 2.

FIG. 3A illustrates the FTL.

Referring to FIG. 3A, the FTL may include a map module MM. However, the present invention is not limited to this specific configuration; the FTL may include other various modules. For example, the FTL may further include a read module, a write module, a garbage collection module, a wear-leveling module, a bad block management module and the like, as is known in the art.

The map module MM may manage the nonvolatile memory zo device 100 and the memory 230 to perform operations related to map data. The operations related to the map data may generally include an address mapping (or translation) operation, a map update operation, a map caching operation and the like, but the present invention is not limited thereto.

When a write request, a logical block address and write data are provided from the host device, the processor 220 may drive the map module MM to store the logical block address in a region of the address buffer AB, the region corresponding to a physical block address in which the write data is to be stored. In this way, the logical block address and the physical block address may be mapped to each other.

The processor 220 may drive the map module MM to generate sequential map entries for the consecutive logical block addresses LBAs (greater than or equal to the threshold value), based on the mapping information between the physical block address and the logical block address stored in the address buffer AB, and store the generated sequential map entries in the sequential map table SMT.

Figure 3B:
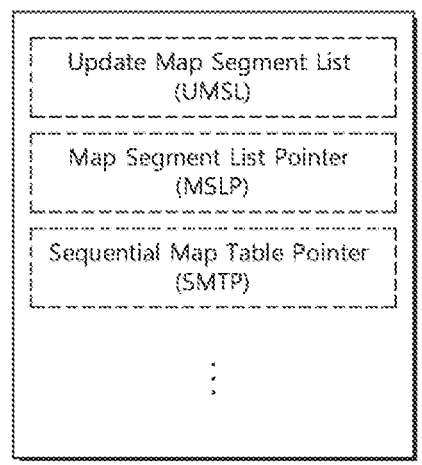
FIG. 3B is a diagram illustrating a metadata region, such as that of FIG. 2.

FIG. 3B illustrates a metadata region 232 included in the first region 231 of the memory 230.

Referring to FIG. 3B, an update map segment list UMSL, a map segment list pointer MSLP, a sequential map table pointer SMTP and the like may be stored in the metadata region 232, but the present invention is not limited to that configuration. Although not illustrated in FIG. 3B, various metadata required for driving various modules included in the FTL may be stored in the metadata region 232, as is known in the art.

Figure 3C:
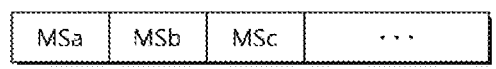
FIG. 3C is a diagram illustrating a structure of an update map segment list, such as that of FIG. 3B.
Figure 3D:
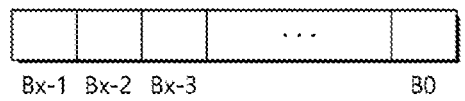
FIGS. 3D and 3E are diagrams illustrating a map segment list pointer and a sequential map table pointer, such as those of FIG. 3B, respectively.
Figure 3E:

FIG. 3C illustrates the update map segment list UMSL, and FIGS. 3D and 3E illustrate the map segment list pointer MSLP and the sequential map table pointer SMTP, respectively.

Referring to FIG. 3C, the update map segment list UMSL may be configured to store an index (e.g., "MSa", "MSb" and "MSc") of each map segment to be updated among the plurality of map segments MS0 to MS99 in an address mapping table 150 of the nonvolatile memory device 100. The index may be a number of alphanumeric indicator. A map segment to be updated may indicate a map segment including one or more logical block addresses of which mapping information is to be updated.

When a write request and a logical block address are received from the host device, the processor 220 may drive the map module MM to store the index of a map segment in the update map segment list UMSL, the map segment including the logical block address received from the host device.

Referring to FIG. 3D, the map segment list pointer MSLP may be configured as a bitmap including x bits B0 to Bx-1. Here, x may be a natural number greater than equal to 0. The bits B0 to Bx-1 of the map segment list pointer MSLP may be configured to indicate locations of corresponding map segments in the update map segment list UMSL. That is, the bits B0 to Bx-1 of the map segment list pointer MSLP may indicate locations of corresponding map segments to be updated through a map update operation.

Referring to FIG. 3E, the sequential map table pointer SMTP may be configured as a bitmap including x bits B0 to Bx-1. Here, x may be a natural number equal to or more than 0. The bits B0 to Bx-1 of the sequential map table pointer SMTP may be configured to indicate the location of corresponding sequential map entries in the sequential map table SMT. During the map update operation, a detecting operation may be started from the sequential map entries indicated by the bits B0 to Bx-1 of the sequential map table pointer SMTP.

Figures 4A, 4B:
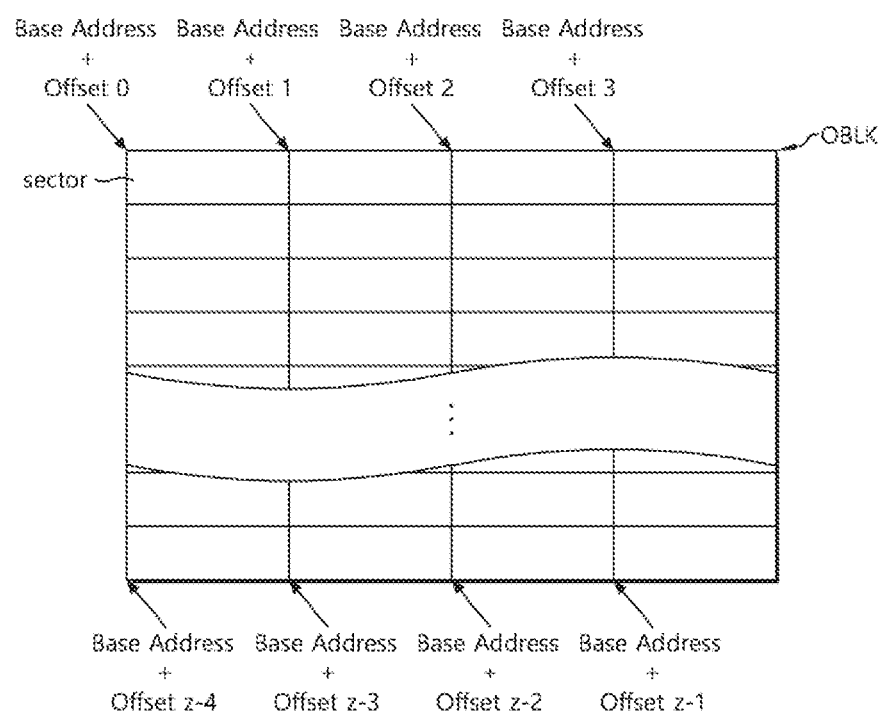
FIG. 4A is a diagram illustrating an address buffer, such as that of FIG. 2.
FIG. 4B is a diagram illustrating an exemplary memory block.

FIG. 4A illustrates the address buffer AB, FIG. 4B illustrates an open memory block OBLK, and FIG. 4C illustrates the sequential map table SMT.

Referring to FIG. 4A, the address buffer AB may include a plurality of regions 1 to ij. Logical block addresses received with write requests from the host device may be stored in the respective regions 1 to ij.

Referring to FIG. 4B, the open memory block OBLK may include a plurality of sectors. The open memory block OBLK may indicate a memory block which is assigned to store write data received from the host device. The open memory block OBLK may be a part or all of a single memory block or a memory region obtained by grouping a plurality of memory blocks within the nonvolatile memory device 100. By way of example, the present embodiment is described in the context of the open memory block OBLK being an entire single memory block.

As illustrated in FIG. 4B, each of the sectors of the open memory block OBLK may have a unique physical block address. For example, the physical block address of each of the sectors may be expressed as the sum of a base address and an offset. When the open memory block OBLK includes z sectors as illustrated in FIG. 4B, the physical block address of the first sector may be expressed as 'base address+offset 0', and the physical block addresses of the second to $z^{th}$ sectors may be expressed as 'base address+offset 1' to 'base address+offset z-1'.

Although not illustrated, the open memory block OBLK may have its own block number, and the processor 220 may acquire the block number when assigning the open memory block OBLK.

Referring to FIGS. 4A and 4B, the regions 1 to ij of the address buffer AB may correspond to the physical block addresses indicating the respective sectors of the open memory block OBLK. For example, the region '1' of the address buffer AB may correspond to the physical block address 'base address+offset 0' indicating the first sector of the open memory block OBLK, and the region 'ij' of the address buffer AB may correspond to the physical block address 'base address+offset z-1' indicating the $z^{th}$ sector of the open memory block OBLK. That is, the regions included in the address buffer AB may respectively correspond to the sectors included in the open memory block OBLK. Furthermore, the order of the regions included in the address buffer AB may be the same as the order of the sectors included in the open memory block OBLK. Based on this configuration, the physical block addresses mapped to the logical block addresses stored in the respective regions 1 to ij of the address buffer AB may be recognized.

Referring to FIG. 4C, the sequential map table SMT may include a plurality of sequential map entries and information indicating whether corresponding sequential map entries are valid (for example, valid information).

When sequential write requests and consecutive logical block addresses are received from the host device, write data may be sequentially stored in consecutive sectors within the open memory block OBLK. Thus, physical block addresses mapped to the consecutive logical block addresses, respectively, may also be consecutive.

The processor 220 may drive the map module MM to generate a sequential map entry corresponding to the provided consecutive logical block addresses. The sequential map entry may include the start logical block address (Start LBA) and a length (Length) of the consecutive logical block addresses and the start physical block address (Start PBA) of the consecutive physical block addresses mapped to the consecutive logical block addresses, and store the generated sequential map entry in the sequential map table SMT. That is, the sequential map table SMT is a separate table for storing only the mapping information between the consecutive logical block addresses and the consecutive physical block addresses. In the sequential map entry, the length may correspond to the number of the consecutive logical block addresses.

The valid information of the sequential map table SMT may indicate whether the corresponding sequential map entry is valid. For example, when first consecutive logical block addresses are received with sequential write requests from the host device at a first time and the first consecutive logical block addresses are received again with sequential write requests from the host device at a second time, a set time interval after the first time, a sequential map entry corresponding to the first consecutive logical block addresses received at the first time may become an invalid entry, and a sequential map entry corresponding to the first consecutive logical block addresses received at the second time may become a valid entry. That is, when a plurality of write operations are performed on the same logical block address, only the most recent mapping information of the logical block address is valid.

FIG. 5 illustrates the AMT 150 of FIG. 1.

Referring to FIG. 5, the AMT 150 may include a plurality of map segments. Each of the map segments may include a plurality of logical to physical (L2P) entries. Each of the L2P entries may include one physical block address and one logical block address mapped to each other. The logical block addresses included in each of the map segments may be aligned and fixed in ascending order, and only the physical block addresses mapped to the respective logical block addresses may be updated.

FIG. 5 illustrates that the AMT 150 includes 100 map segments (0 to 99), and each of the map segments 0 to 99 includes 100 L2P entries. However, the number of the map segments and the number of the L2P entries per map segment are not limited thereto.

Figure 6A:
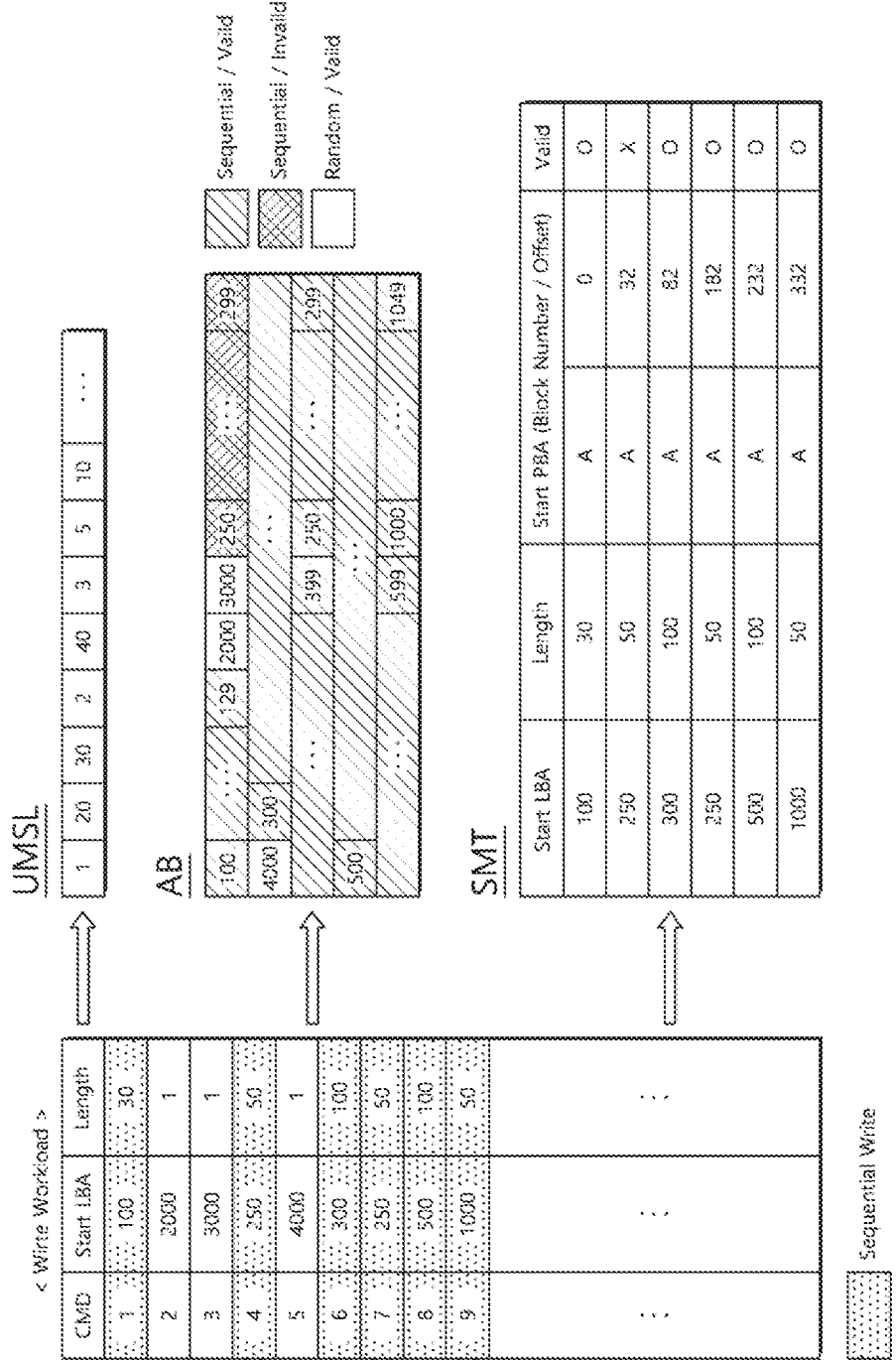
FIG. 6A is a diagram illustrating logical block addresses stored in an address buffer and a map segment list and a sequential map table generated, during a write operation, in accordance with an embodiment.

FIG. 6A illustrates that logical block addresses are stored in the address buffer AB, a map segment to be updated is stored in the update map segment list UMSL, and sequential map entries are stored in the sequential map table SMT, during a write operation. In FIG. 6A, 'write workload' may represent write requests which are received from the host device and processed. FIG. 6A illustrates, by way of example, that 'write workload' includes a command number, a start logical block address and a length. Furthermore, suppose that commands 1 to 9 are sequentially received from the host device.

Referring to FIG. 6A, write requests corresponding to commands 1, 4 and 6 to 9 may be sequential write requests, and write requests corresponding to commands 2, 3 and 5 may be random write requests.

When a write request and a logical block address are received from the host device, the processor 220 may drive the map module MM to store the logical block address in an arbitrary region of the address buffer AB. The region of the address buffer AB, in which the logical block address is to be stored, may be indicated by an address buffer pointer (not illustrated). When the logical block address is stored in the region indicated by the address buffer pointer, the address buffer pointer may be changed to a value indicating a region in which the next logical block address is to be stored within the address buffer AB. By way of example, the present embodiment is based on the supposition that the address buffer AB is empty.

The processor 220 may sequentially store 30 logical block addresses (LBA100 to LBA129) from the start logical block address LBA100 corresponding to the command 1 in 30 regions from a first region within the address buffer AB. As described above, since the regions of the address buffer AB respectively correspond to the sectors of the open memory block OBLK (refer to FIG. 4B), physical block addresses, sectors of which are to store the write data, may be determined according to the regions storing the logical block addresses LBA100 to LBA129 within the address buffer AB.

In the same way, the logical block addresses corresponding to the commands 2 to 9 may be sequentially stored in the regions of the address buffer AB. Since the start logical block address LBA250 corresponding to the command 7 is equal to the start logical block address LBA250 corresponding to the command 4, the physical block addresses mapped to the logical block addresses corresponding to the command 4 received before the command 7 may become invalid mapping information, and the physical block addresses mapped to the logical block addresses corresponding to the command 7 received after the command 4 may become valid mapping information.

The processor 220 may sequentially store the numbers of map segments in the update map segment list UMSL, the map segments including the logical block addresses received with the write requests from the host device.

For example, referring to FIG. 6A, the logical block addresses LBA100 to LBA129 corresponding to the command 1 may be included in a map segment 1. Therefore, the processor 220 may store the index of the map segment 1 in the update map segment list UMSL. Similarly, the indexes of map segments including the logical block addresses corresponding to the commands 2 to 9, respectively (i.e., indexes of a map segment 20, a map segment 30, a map segment 2, a map segment 40, a map segment 3, a map segment 5 and a map segment 10 as shown in the update map segment list UMSL of FIG. 6A) may be sequentially stored in the update map segment list UMSL. Then, when a map update operation is performed, the processor 220 may read map segments to be updated from the AMT 150 by referring to the update map segment list UMSL, and store the read map segments in the map update buffer MUB of the memory 230.

The processor 220 may generate a sequential map entry for consecutive logical block addresses among the logical block addresses stored in the address buffer AB, and store the generated sequential map entry in the sequential map table SMT. Referring to FIG. 6A, the sequential map table SMT may include sequential map entries respectively corresponding to the command 1, the command 4 and the commands 6 to 9. The valid information of the invalid sequential map entry for the command 4 may be displayed as 'X', and the valid information of the valid sequential map entry for the command 7 may be displayed as 'O'.

By way of example, suppose that the block number of the open memory block OBLK is 'A', and the write data are stored in the open memory block OBLK from the first sector.

FIG. 6B illustrates an example in which mapping information of consecutive logical block addresses is updated.

When the map update operation is triggered, the processor 220 may drive the map module MM to identify the index of a map segment to be updated by referring to the update map segment list UMSL. When the index of the map segment to be updated is identified, the map module MM may read that map segment, i.e. the map segment 1, from the AMT 150 of the nonvolatile memory device 100 and store the read map segment in the map update buffer MUB of the memory 230. Each of the regions storing the map segment 1 in the map update buffer MUB may indicate one logical block address, and a null value, i.e. 'XXX', stored in the region may indicate that a previously mapped physical block address or mapping information is not present.

Referring to FIG. 6A, logical block addresses corresponding to a completed write operation in response to the command 1 may range from LBA100 to LBA129. Thus, as illustrated in FIG. 6B, only logical block addresses indicated by a dotted box may be addresses to be updated and the other logical block addresses may not be addresses to be updated at the time the write operation is completed in response to the command 1.

The map module MM may first check whether a sequential map entry including the logical block addresses 'LBA100 to LBA129' are present in the sequential map table SMT. As illustrated in FIG. 6A, the sequential map entry including the logical block addresses 'LBA100 to LBA129' may be present in the sequential map table SMT. Thus, the map module MM may store a start physical block address 'A, 0' in a region corresponding to the start logical block address LBA100 of the logical block addresses 'LBA100 to LBA129', and sequentially store physical block addresses in regions corresponding to the other logical block addresses 'LBA101 to LBA129', the physical block addresses having offsets which are sequentially increased by 1 from the start physical block address 'A, 0'. In this way, the changing of the mapping information on the logical block addresses 'LBA100 to LBA129' may be completed. The map segment 1 of which the mapping information has been completely changed may be stored in the AMT 150 of the nonvolatile memory device 100 again.

Figure 6C:
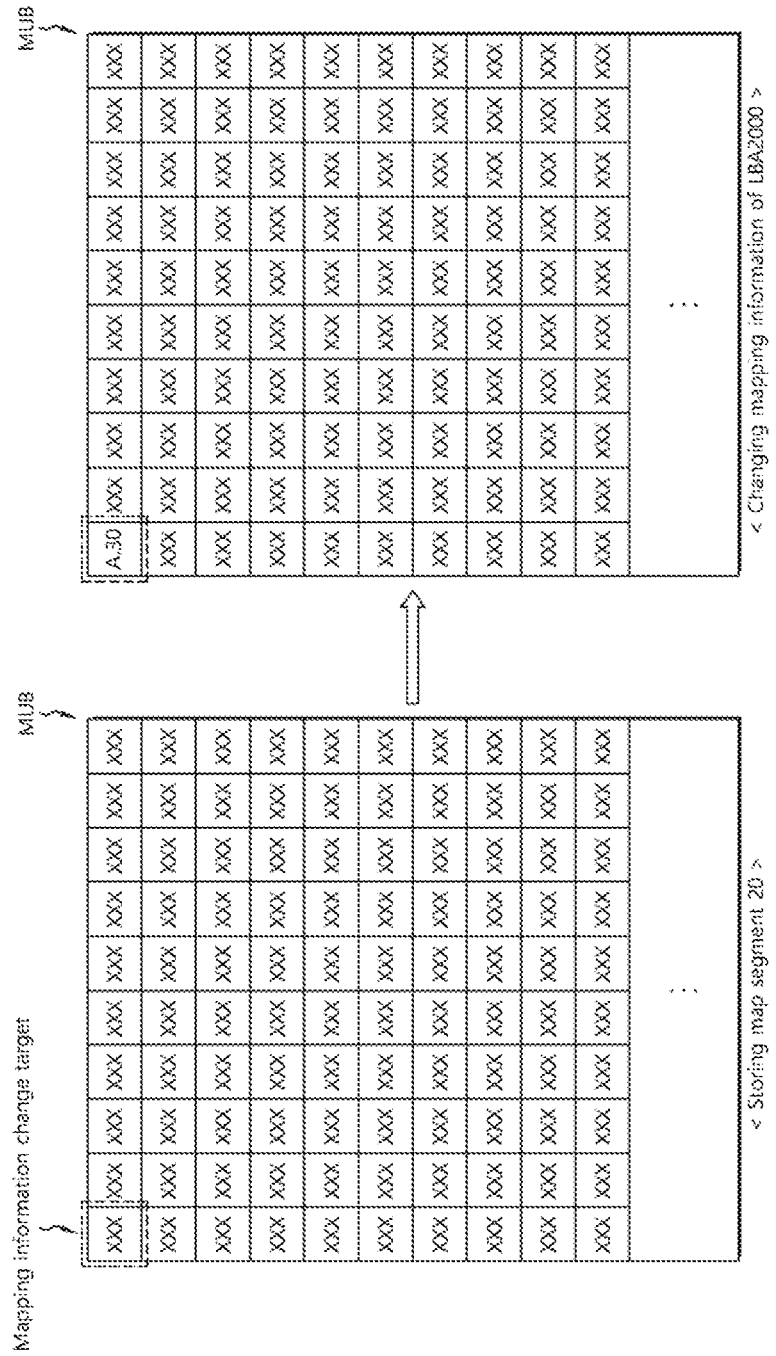
FIG. 6C is a diagram illustrating an example in which mapping information of random logical block addresses is changed.

FIG. 6C illustrates an example in which mapping information of random logical block addresses is changed.

The map module MM may read a map segment (i.e., the map segment 20), on which the map update operation is to be performed, from the AMT 150 of the nonvolatile memory device 100, and store the read map segment 20 in the map update buffer MUB of the memory 230.

The map module MM may first check whether a sequential map entry including a logical block address 'LBA2000' is present in the sequential map table SMT. As illustrated in FIG. 6A, the sequential map entry including the logical block address 'LBA2000' is not present in the sequential map table SMT. Thus, the map module MM may detect a region where the logical block address 'LBA2000' is stored in the address buffer AB.

When the region where the logical block address 'LBA2000' is stored in the address buffer AB is detected, the map module MM may store a physical block address 'A, 30' corresponding to the detected region of the address buffer AB in a region corresponding to the logical block address LBA2000 within the map update buffer MUB. In this way, the changing of the mapping information on the logical block address 'LBA2000' may be completed. The map segment 20 of which the mapping information has been completely changed may be stored in the AMT 150 of the nonvolatile memory device 100 again.

As such, the data storage device may separately generate and manage a sequential map entry for consecutive logical block addresses to be mapped also to consecutive physical block addresses, and change information of the consecutive physical block addresses mapped to the consecutive logical block addresses based on the sequential map entry during the map update operation, thereby reducing the time required for the map update operation.

FIG. 7 is a flowchart illustrating an operating method of the data storage device in accordance with an embodiment. In describing such method, one or more of FIGS. 1 to 6C may be referred to, in addition to FIG. 7.

At step S710, the processor 220 of the controller 200 may determine whether to perform a map update operation. The map update operation may be performed when the address buffer AB is full of logical block addresses, but the present invention is not limited to that specific condition. For example, the map update operation may be performed when the logical addresses stored in the address buffer AB reaches a certain percentage of the capacity of the address buffer AB. When it is determined that the map update operation needs to be performed, the procedure may proceed to step S720.

At step S720, the processor 220 may drive the map module MM to read a map segment from the AMT 150 of the nonvolatile memory device 100, the map segment including logical block addresses of which mapping information is to be updated. Then, the processor 220 may store the read map segment in the map update buffer MUB of the memory 230. The processor 220 may identify the map segment to be updated by referring to the map segment list pointer MSLP and the update map segment list UMSL stored in the metadata region 232 of the memory 230.

At step S730, the processor 220 may check the sequential map table pointer SMTP stored in the metadata region 232 and the sequential map table SMT stored in the memory 230 and determine whether there is a sequential map entry including the logical block addresses to be updated. When a sequential map entry including the logical block addresses to be updated is present, the procedure may proceed to step S740. On the other hand, when there is no sequential map entry, the procedure may proceed to step S750.

At step S740, the processor 220 may store within the map update buffer MUB consecutive physical addresses, which are identified by the start logical address (Start LBA), the length (Length) and the start physical address (Start PBA) in the sequential map entry identified in step S730, in consecutive regions indicating consecutive logical addresses LBAs, which are identified by the start logical address (Start LBA) and the length (Length) in the identified sequential map entry. That is, the processor 220 may change within the map update buffer MUB a physical block address into a start physical block address of the sequential map entry, the physical block address being mapped to the start logical block address in the sequential map entry identified in step S730. Furthermore, the processor 220 may change physical block addresses of the other logical block addresses into physical block addresses obtained by sequentially increasing the start physical block address by 1, and store the changed physical block addresses. The start physical block address may include a block number and an offset, and the changed physical block addresses mapped to the other logical block addresses, respectively, may have offsets which are sequentially increased by 1.

At step S750, the processor 220 may detect regions where the logical block addresses to be updated are stored in the address buffer AB of the memory 230, and acquire physical block addresses corresponding to the detected regions.

At step S760, the processor 220 may change the physical block addresses mapped to the respective logical block addresses to be updated into the physical block addresses acquired at step S750, and store the changed physical block addresses within the map update buffer MUB.

Steps S750 and S760 may be repeatedly performed until the mapping information of all logical block addresses to be updated has been completed.

At step S770, the processor 220 may determine whether the changing of the mapping information of the logical block addresses to be updated has been completed. When the changing of the mapping information is not completed, the procedure may proceed to step S750. When the changing of the mapping information is completed, the procedure may proceed to step S780.

At step S780, the processor 220 may determine whether the map update operation has been completed. The operation of determining whether the map update operation has been completed may indicate an operation of determining whether the mapping information on the plurality of map segments including the logical block addresses to be updated has been completely changed. When the map update operation has been completed, the procedure may be ended. When the map update operation is not completed, the procedure may proceed to step S790.

At step S790, the processor 220 may read a map segment from the AMT 150 of the nonvolatile memory device 100 by referring to the map segment list pointer MSLP and the update map segment list UMSL, the map segment including logical block addresses of which mapping information is to be updated in the following order. Then, the processor 220 may store the read map segment in the map update buffer MUB of the memory 230. Subsequently, the procedure may proceed to step S730.

In accordance with embodiments of the present invention, the data storage device can separately generate and manage a sequential map entry for consecutive logical block addresses corresponding to sequential write requests, and change mapping information of the consecutive logical block addresses by sequentially increasing the mapping information using the sequential map entry, thereby reducing the map update time.

Figure 8:
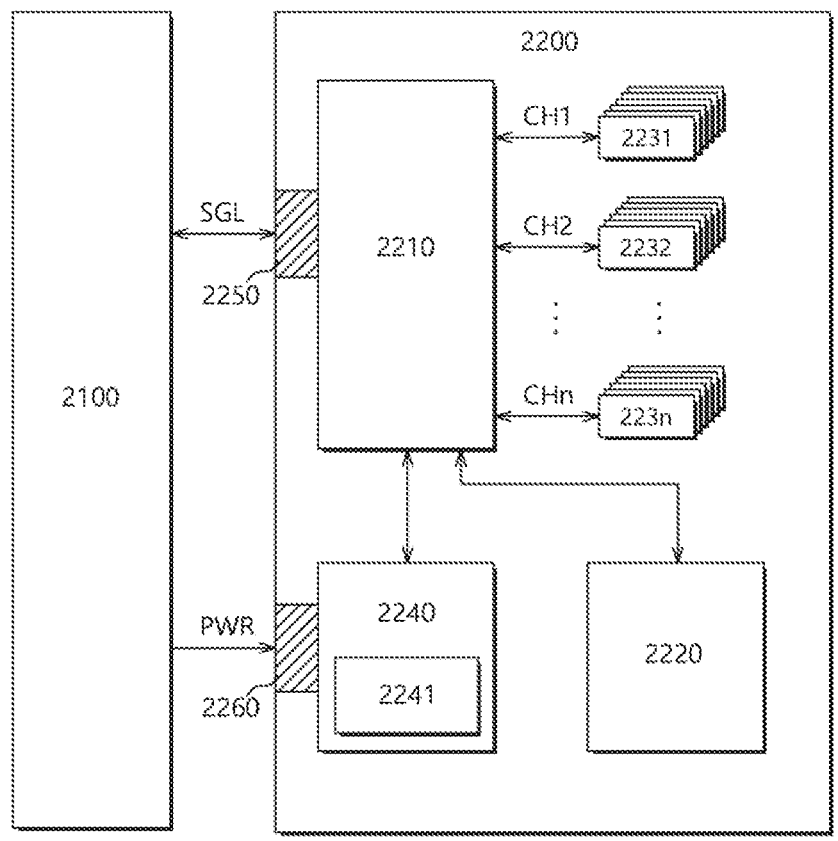
FIG. 8 is a diagram illustrating a data processing system including a solid state drive (SSD) in accordance with an embodiment.

FIG. 8 illustrates a data processing system including a solid state drive (SSD) in accordance with an embodiment. Referring to FIG. 8, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD

2200. The power supply 2240 may include an auxiliary power supply 2241. The auxiliary power supply 2241 may supply the power so that the SSD 2200 is properly terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured as any of various types of connectors according to an interfacing method between the host apparatus 2100 and the SSD 2200.

Figure 9:
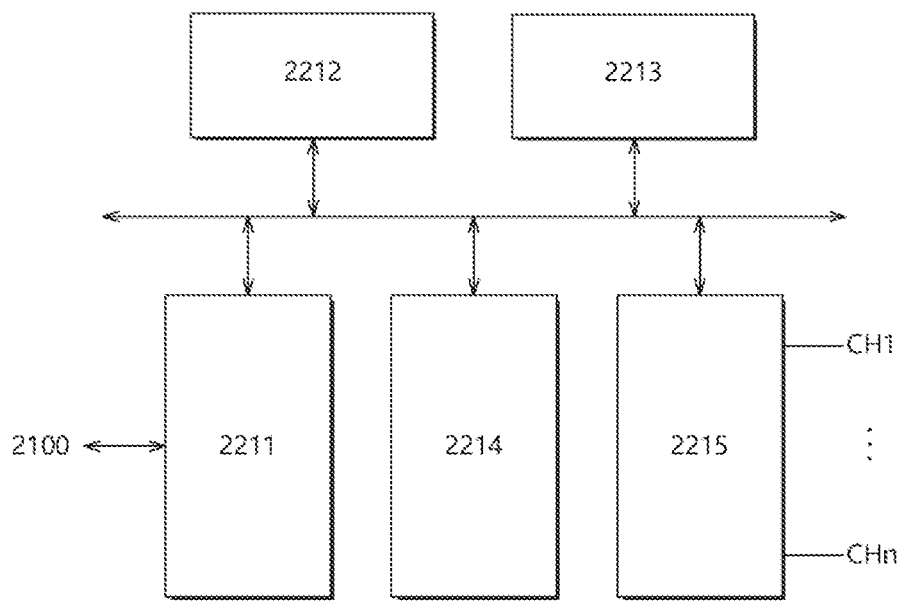
FIG. 9 is a diagram illustrating a controller, such as that illustrated in FIG. 8.

FIG. 9 illustrates the controller 2210 of FIG. 8. Referring to FIG. 9, the controller 2210 may include a host interface 2211, a control component 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any of a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface 2211 may perform a disc emulation function that the host apparatus 2100 recognizes the SSD 2200 as a general-purpose data storage apparatus, for example, a hard disc drive HDD.

The control component 2212 may analyze and process the signal SGL input from the host apparatus 2100. The control component 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 10:
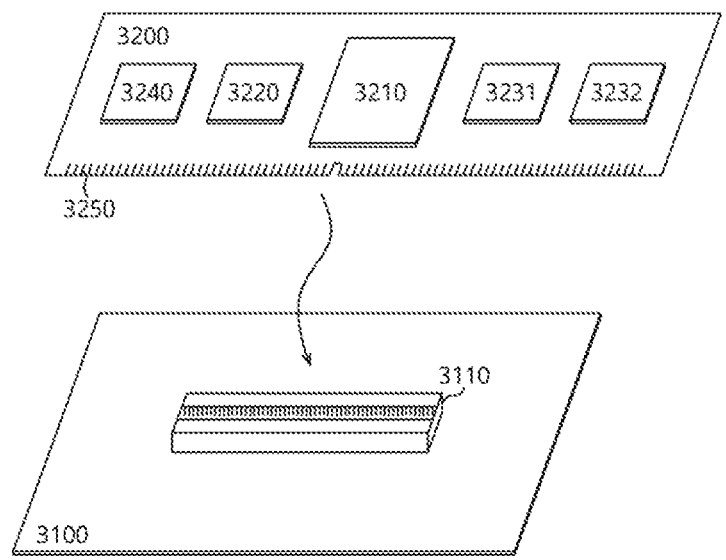
FIG. 10 is a diagram illustrating a data processing system including a data storage apparatus in accordance with an embodiment.

FIG. 10 illustrates a data processing system including a data storage apparatus in accordance with an embodiment. Referring to FIG. 10, a data processing system 3000 may include a host apparatus 3100 and a data storage apparatus 3200.

The host apparatus 3100 may be configured in a board form such as a printed circuit board (PCB). Although not shown in FIG. 10, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 and 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 9.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any side of the data storage apparatus 3200.

Figure 11:
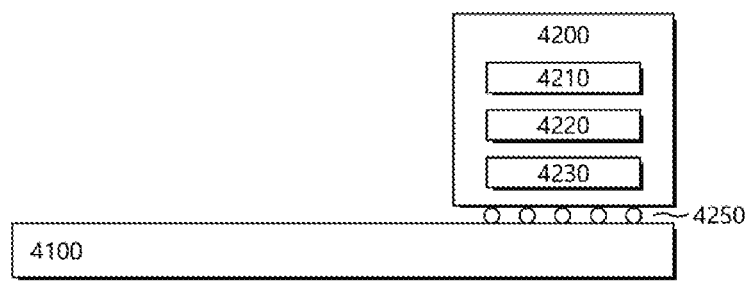
FIG. 11 is a diagram illustrating a data processing system including a data storage apparatus in accordance with an embodiment.

FIG. 11 illustrates a data processing system including a data storage apparatus in accordance with an embodiment. Referring to FIG. 11, a data processing system 4000 may include a host apparatus 4100 and a data storage apparatus 4200.

The host apparatus 4100 may be configured in a board form such as a PCB. Although not shown in FIG. 11, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 9.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 12:
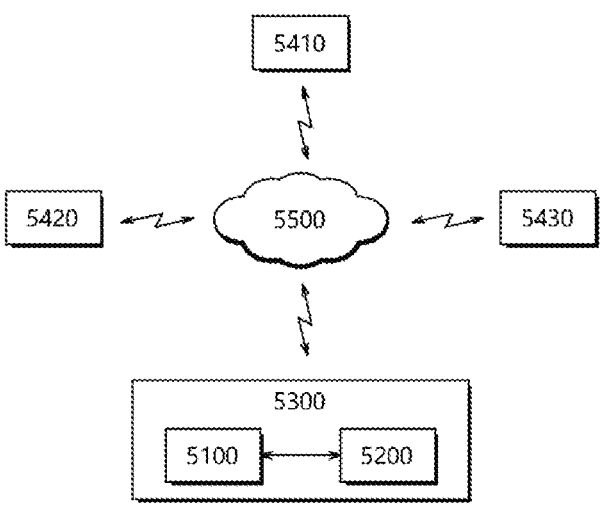
FIG. 12 is a diagram illustrating a network system including a data storage apparatus in accordance with an embodiment.

FIG. 12 illustrates a network system 5000 including a data storage apparatus in accordance with an embodiment. Referring to FIG. 12, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage device 10 of FIG. 1, the SSD 2200 of FIG. 8, the data storage apparatus 3200 of FIG. 10, or the data storage apparatus 4200 of FIG. 11.

Figure 13:
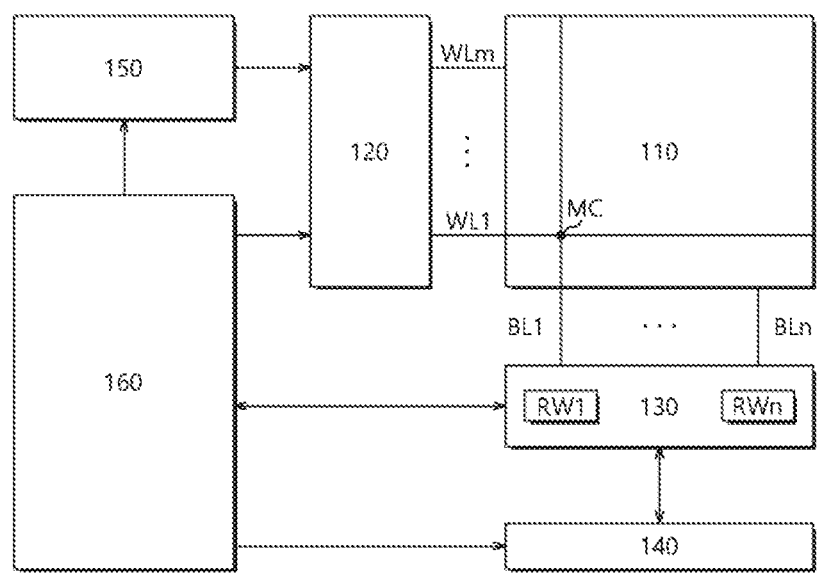
FIG. 13 is a diagram illustrating a nonvolatile memory device included in a data storage apparatus in accordance with an embodiment.

FIG. 13 illustrates a nonvolatile memory device included in a data storage apparatus in accordance with an embodiment. Referring to FIG. 13, a nonvolatile memory device 100 may include a memory cell array 110, a row decoder 120, a column decoder 140, a data read/write block 130, a voltage generator 150, and control logic 160.

The memory cell array 110 may include memory cells MC arranged in regions in which word lines WL1 to WLm and bit lines BL1 to BLn cross to each other.

The row decoder 120 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

While various embodiments have been illustrated and described, it will be understood to those skilled in the art that the embodiments described are examples only. Accordingly, the present invention is not limited based on the described embodiments. Rather, the present invention encompasses all variations and modifications that fall within the scope of the claims and their equivalents.

What is claimed is:

1. A data storage device comprising:
   a nonvolatile memory device including an address mapping table;
   a memory including a sequential map table, wherein the sequential map table stores sequential map entries for consecutive logical block addresses among logical block addresses, the logical block addresses being received with write requests from a host device; and
   a processor configured to:
   read one or more map segments, including logical block addresses of which mapping information is to be updated, from the address mapping table when a map update operation is triggered;
   store the read one or more map segments in the memory;
   sequentially change physical block addresses mapped to the respective logical block addresses to be updated, using a first sequential map entry including the logical block addresses to be updated which are stored in the sequential map table; and
   store the changed physical block addresses in the memory,
   wherein the first sequential map entry comprises a start logical block address, a logical block address length and a start physical block address.

2. The data storage device of claim 1, wherein the start physical block address comprises a block number and an offset.

3. The data storage device of claim 2, wherein the processor sequentially changes the physical block addresses mapped to the respective logical block addresses to be updated by changing a physical block address mapped to a start logical block address of the logical block addresses to be updated to the start physical block address, and changing physical block addresses mapped to the other logical block addresses into physical block addresses obtained by sequentially incrementing the offset from the start physical block address.

4. The data storage device of claim 1, wherein the memory further comprises an address buffer having regions in which the logical block addresses received with the write requests from the host device are stored.

5. The data storage device of claim 4, wherein the processor determines whether the first sequential map entry is present in the sequential map table, wherein the processor detects regions where the logical block addresses to be updated are respectively stored in the address buffer when the first sequential map entry is not present, and changes the physical block addresses mapped to the logical block addresses to be updated using physical block addresses corresponding to the detected regions, respectively.

6. The data storage device of claim 4, wherein the map update operation is triggered when the address buffer is filled to capacity with logical block addresses.

7. An operating method of a data storage device which includes a nonvolatile memory device including an address mapping table and a controller for controlling the nonvolatile memory device, the operating method comprising:
   reading a map segment, including logical block addresses of which mapping information is to be updated, from the address mapping table when a map update operation is triggered, and storing the read map segment in a memory; and
   sequentially changing physical block addresses mapped to the respective logical block addresses to be updated, using a sequential map entry including the logical block addresses to be updated, and storing the changed physical block addresses in the memory,
   wherein the sequential map entry comprises a start logical block address, a logical block address length and a start physical block address.

8. The operating method of claim 7, wherein the reading of the map segment from the address mapping table and storing the read map segment in the memory is performed by referring to an update map segment list stored in the memory.

9. The operating method of claim 7, further comprising determining whether the sequential map entry including the logical block addresses to be updated is present.

10. The operating method of claim 7, wherein the start physical block address comprises a block number and an offset.

11. The operating method of claim 10, wherein the sequentially changing of the physical block addresses mapped to the respective logical block addresses to be updated comprises:
    changing a physical block address mapped to a start logical block address of the logical block addresses to be updated into the start physical block address; and
    changing physical block addresses mapped to the other logical block addresses of the logical block addresses to be updated into physical block addresses obtained by sequentially increasing the offset by 1 from the start physical block address.

12. The operating method of claim 7, further comprising determining whether the sequential map entry including the logical block addresses to be updated is present.

13. The operating method according to claim 12, further comprising:
    detecting regions where the logical block addresses to be updated are stored in an address buffer including regions in which logical block addresses received with write requests from a host device are respectively stored, when the sequential map entry is not present; and
    changing physical block addresses mapped to the logical block addresses to be updated into physical block addresses corresponding to the detected regions.

14. The operating method of claim 13, wherein the map update operation is triggered when the address buffer is filled to capacity with logical block addresses.

15. A data storage device comprising:
    an address mapping table containing first information between logical addresses and physical addresses respectively mapped to each other;
    a sequential map table containing one or more sequential map entries each including a start logical address and a length of consecutive logical addresses and a start physical address; and
    a control component configured to:
    identify, within the sequential map table, a to-be-updated sequential map entry based on consecutive logical addresses in second information to be updated among the first information;
    update consecutive physical addresses corresponding to the consecutive logical addresses in the second information based on the identified sequential map entry; and
    update the first information based on the second information.

* * * * *